(12) United States Patent
Jung et al.

(10) Patent No.: US 10,541,210 B2
(45) Date of Patent: Jan. 21, 2020

(54) ELECTRONIC DEVICE HAVING ELECTROMAGNETIC INTERFERENCE SHIELDING LAYER AND METHOD OF MANUFACTURING THE SAME

(71) Applicant: NTRIUM INC., Gyeonggi-do (KR)

(72) Inventors: Se Young Jung, Gyeonggi-do (KR); Jung Woo Hwang, Gyeonggi-do (KR); Yoon Hyun Kim, Gyeonggi-do (KR); Ki Su Joo, Gyeonggi-do (KR); Kyu Jae Lee, Gyeonggi-do (KR)

(73) Assignee: NTRIUM INC., Gyeonggi-Do (KR)

(*) Notice: Subject to any disclaimer, the term of this patent is extended or adjusted under 35 U.S.C. 154(b) by 0 days.

(21) Appl. No.: 16/211,959

(22) Filed: Dec. 6, 2018

(65) Prior Publication Data

US 2019/0206804 A1 Jul. 4, 2019

(30) Foreign Application Priority Data

Dec. 29, 2017 (KR) .................. 10-2017-0184580
Mar. 13, 2018 (KR) .................. 10-2018-0029232

(51) Int. Cl.
*H01L 23/552* (2006.01)
*H01L 21/3205* (2006.01)
*H01L 23/31* (2006.01)
*B22F 7/04* (2006.01)

(52) U.S. Cl.
CPC ............ *H01L 23/552* (2013.01); *B22F 7/04* (2013.01); *H01L 21/32056* (2013.01); *H01L 23/3128* (2013.01); *B22F 2007/042* (2013.01)

(58) Field of Classification Search
CPC ............ B22F 7/04; B22F 7/08; H01L 23/552
See application file for complete search history.

(56) References Cited

U.S. PATENT DOCUMENTS

2006/0099403 A1* 5/2006 Johnson .............. H01L 23/3733
428/323

FOREIGN PATENT DOCUMENTS

| KR | 1020070097626 | 10/2007 |
| KR | 1020160067335 | 6/2016 |
| KR | 1020170066067 | 6/2017 |
| KR | 1020170119421 | 10/2017 |
| WO | 2013018253 A1 | 2/2013 |

* cited by examiner

*Primary Examiner* — Daniel P Shook
(74) *Attorney, Agent, or Firm* — Mayer & Williams, PC; Stuart H. Mayer

(57) ABSTRACT

Provided is an electronic device including: an electronic component; and an electromagnetic interference shielding layer formed on at least a portion of the electronic component. The electromagnetic interference shielding layer includes: magnetic particles for electromagnetic wave absorption, each of the magnetic particles having a conductive film on a surface of the magnetic particle; and a conductive portion where conductive metal particles for electromagnetic shielding are sintered and formed on the conductive film of the magnetic particles.

15 Claims, 3 Drawing Sheets

ELECTRONIC DEVICE HAVING ELECTROMAGNETIC INTERFERENCE SHIELDING LAYER AND METHOD OF MANUFACTURING THE SAME

CROSS-REFERENCE TO RELATED APPLICATIONS

This U.S. non-provisional patent application claims priorities to Korean Patent Application No. 10-2017-0184580, filed on Dec. 29, 2017, and Korean Patent Application No. 10-2018-0029232, filed on Mar. 13, 2018, the entire contents of which are hereby incorporated by reference.

BACKGROUND

The present invention relates to an electronic device, and more particularly, to an electronic device having an electromagnetic interference shielding layer and a method of manufacturing the same.

Recently, with the development of electric and electronic industry and information and communication technology, various electronic devices such as household appliances, industrial devices, and information communication devices are used. Electromagnetic interference (EMI) generated in such an electronic device may cause interference between devices or may be harmful to a human body. Therefore, a technique for blocking such electromagnetic waves has been developed. Meanwhile, as electronic devices recently become portable, they become smaller, thinner, and lighter. Therefore, techniques for coating a shielding layer to block electromagnetic waves in electronic components within such small electronic devices have been developed.

In the above-described electromagnetic wave shielding, when the electromagnetic wave is in a low frequency band, it is difficult to effectively shield electromagnetic waves with conductive shielding materials alone. Therefore, a double structure of a shielding layer and an absorbing layer is required, and in this case, there is a problem that the productivity is lowered and the manufacturing cost is increased. In addition, there is a problem that the coating layer for shielding electromagnetic waves is unevenly formed at the upper end portion and the side portion of the electronic product.

SUMMARY

An object of the present invention is to provide an electronic device having an electromagnetic wave shielding structure for effectively shielding electromagnetic waves in a low frequency band and a method of manufacturing the same. However, these problems are illustrative, and the scope of the present invention is not limited thereto.

An embodiment of the inventive concept provides an electronic device including: an electronic component; and an electromagnetic interference shielding layer formed on at least a portion of the electronic component, wherein the electromagnetic interference shielding layer includes: magnetic particles with a conductive film formed on its surface for electromagnetic wave absorption; and a conductive portion where conductive metal particles for electromagnetic shielding are sintered and formed on the conductive film of the magnetic particles.

In an embodiment, the electromagnetic interference shielding layer may be formed by spraying a paste containing the conductive metal particles and the magnetic particles where the conductive film is formed, on the electronic component and then, thermally treating the applied paste.

In an embodiment, in the paste, the metal particles may be organic metal particles, and the magnetic particles may have a flake shape In an embodiment, the organic metal particles may include organic silver particles.

In an embodiment, the paste may further include at least two types of solvents having different boiling points so as to control the flowability of the paste at a side portion of the electronic component during a spraying process.

In an embodiment, the electromagnetic interference shielding layer may have a structure in which the metal particles are sintered on a surface of the magnetic particles so as to be entirely connected to each other to have conductivity.

In an embodiment, the conductive film may be formed by plating a conductive material on the magnetic particles, wherein the conductive material may include nickel (Ni), palladium (Pd), silver (Ag), or graphite (C).

In an embodiment, the electronic component may be a semiconductor package including: a package substrate; a semiconductor element mounted on the package substrate; and a molding member configured to protect the semiconductor element, wherein the electromagnetic interference shielding layer may be formed on an upper portion and a side portion of the semiconductor package.

In an embodiment of the inventive concept, a method of manufacturing an electronic device includes: providing an electronic component; and forming an electromagnetic interference shielding layer on at least a portion of the electronic component, wherein the electromagnetic interference shielding layer includes: magnetic particles with a conductive film formed on its surface for electromagnetic wave absorption; and a conductive portion where conductive metal particles for electromagnetic shielding are sintered and formed on the conductive film of the magnetic particles.

In an embodiment, the forming of the electromagnetic interference shielding layer may include: spraying a paste containing the conductive metal particles and the magnetic particles where the conductive film is formed, on at least a portion of the electronic component; and thermally treating the applied paste.

In an embodiment, in the spraying of the paste, the paste may further include at least two types of solvents having different boiling points so as to control the flowability of the paste at a side portion of the electronic component.

In an embodiment of the inventive concept, an electronic device includes: an electronic component; and an electromagnetic interference shielding layer where conductive metal particles for electromagnetic shielding are sintered on a surface of magnetic particles for electromagnetic wave absorption and are formed as a conductive layer, on at least a portion of the electronic component.

In an embodiment, the electromagnetic interference shielding layer may be formed by spraying a paste containing the conductive metal particles and the magnetic particles on the electronic component and then, thermally treating the applied paste.

In an embodiment, the paste may further include at least two types of solvents having different boiling points so as to control the flowability of the paste at a side portion of the electronic component during a spraying process.

In an embodiment, the electromagnetic interference shielding layer may have a structure in which the metal particles are sintered on a surface of the magnetic particles so as to be entirely connected to each other to have conductivity.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
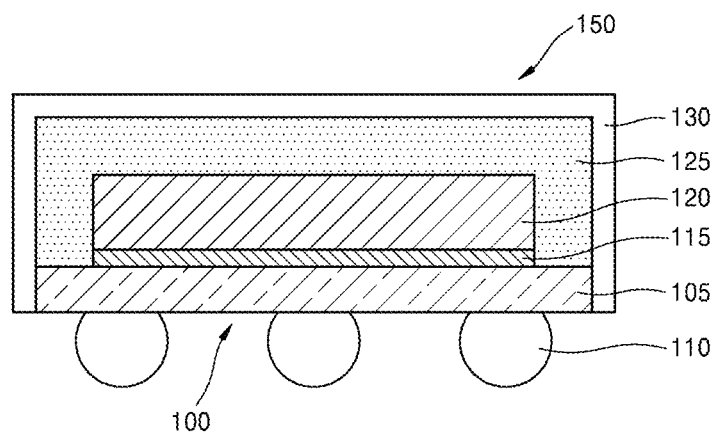
FIG. 1 is a schematic cross-sectional view showing an electronic device according to an embodiment of the present invention.

Hereinafter, preferred embodiments of the present invention will be described in detail with reference to the accompanying drawings.

Embodiments of the present invention are provided to more fully describe the present invention to those skilled in the art, and the following embodiments may be modified in various forms, and the scope of the present invention is not limited to the following embodiments. Rather, these embodiments are provided so that this disclosure will be more thorough and complete, and will fully convey the scope of the invention to those skilled in the art. In addition, in the drawings, the thickness and size of each layer are exaggerated for convenience and clarity of explanation.

FIG. 1 is a schematic cross-sectional view showing an electronic device 150 according to an embodiment of the present invention.

Referring to FIG. 1, the electronic device 150 may include an electronic component 100, and an electromagnetic interference (EMI) shielding layer 130 formed on at least a portion of the electronic component 100.

The electronic component 100 may be any of those products that are exposed to electromagnetic waves and require electromagnetic interference. For example, the electronic component 100 is a component used in mobile portable devices, such as mobile phones, smart phones, tablet devices, and the like and may include an application processor chip, a memory chip, a communication chip, a modem chip, a heartbeat chip, and the like.

More specifically, the electronic component 100 may include a semiconductor package. For example, such a semiconductor package may have various structures such as a flip chip package, a chip scale package (CSP), a package on package (POP), a multi chip package (MCP), a multistack package (MSP), system in package (SIP), a wafer level package (WLP), and a fan-out wafer level package (fan-out WLP).

For example, as shown in FIG. 1, the semiconductor package 150 includes a package substrate 105, a semiconductor element 120 mounted on the package substrate 105, and a molding member 120 for protecting the semiconductor element 120. For example, the package substrate 105 may be a printed circuit board (PCB) where circuit wiring is formed on the one surface and external terminals 110 electrically connected to the circuit wiring are formed on the other surface. As another example, the package substrate 105 may be composed of a lead frame or the like.

The semiconductor element 120 may be mounted on the package substrate 105 using the adhesive member 115. For example, the semiconductor device 120 may be inverted into a flip chip form and bonded to a pad on the package substrate 105 using the conductive adhesive member 115. As another example, the semiconductor element 120 is mounted on the package substrate 105 using an insulating adhesive member 115, and the bonding wire may electrically connect the pad of the semiconductor element 120 and the pad of the package substrate 105.

The molding member 125 may be formed to cover the semiconductor element 120 on the package substrate 105. For example, the molding member 125 may include a resin such as an epoxy molding compound (EMC).

The electromagnetic interference shielding layer 130 may be formed to protect the electronic component 100 from electromagnetic waves on at least a portion of the electronic component 100, for example, the upper and side portions exposed to electromagnetic waves. In some embodiments, the electromagnetic interference shielding layer 130 may be connected to the ground portion of the electronic component 100 so that the electromagnetic waves may exit into the ground portion.

The electromagnetic interference shielding layer 130 may be formed using a coating method, and for example, may be formed by applying a paste containing an electromagnetic wave shielding material onto the electronic component 100 and then, performing curing or heat treatment. Various methods may be considered for the application of the paste, but a spraying method using a nozzle may be applied simply and economically.

The electromagnetic interference shielding layer 130 may include both an electromagnetic wave shielding material and an electromagnetic wave absorbing material in order to effectively block electromagnetic waves in a low frequency band. For example, the electromagnetic interference shielding layer 130 may include magnetic particles 55 for electromagnetic wave absorption and a conductive portion 50a (see FIG. 4) formed by sintering conductive metal particles 50 for shielding electromagnetic waves.

Figure 3A:
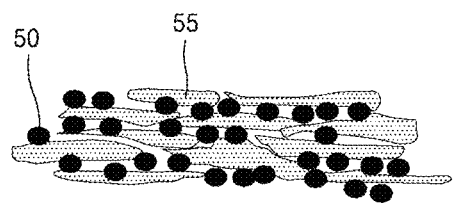
FIGS. 3A and 3B are schematic views showing a paste used in an electronic device according to an embodiment of the present invention.
Figure 3B:
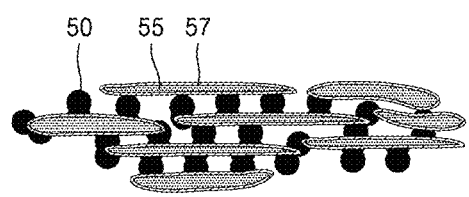

As shown in FIG. 3A, in order to effectively block electromagnetic waves in a low frequency band, the paste for forming the electromagnetic interference shielding layer 130 may include conductive metal particles 50 for electromagnetic wave shielding and magnetic particles 55 for electromagnetic wave absorption. Furthermore, as shown in FIG. 3B, a conductive film 57 may be formed on the surface of the magnetic particles 55 to improve the contact characteristics of the metal particles 50.

The metal particles 50 may be particles of various metals, for example, one of copper (Cu), silver (Ag), aluminum (Al), titanium (Ti), gold (Au), nickel (Ni), cobalt (Co), a composite thereof, or mixed particles thereof. In some embodiments, the metal particles 50 may be composed of organic silver for ease of manufacture and sinter production.

For example, the magnetic particles 55 may be contained in the paste in an amount of 2 to 30% by weight, more specifically 15 to 30% by weight. The magnetic particles 55 in the paste may be provided in a flake shape so as to be well mixed with a large surface area. The magnetic particles 55 may be composed of particles of various magnetic bodies, and for example, may include one selected from an iron-nickel alloy including iron (Fe), nickel (Ni), and permalloy, steel, stainless steel, iron-silicon based alloy, cobalt (Co), iron oxide ($Fe_2O_3$, $Fe_3O_4$), chromium oxide, ferrite, FeMn ferrite, FeZn ferrite, and sendust, or a mixed particle thereof. For example, the sendust particles may be in the form of a powder of an alloy containing aluminum, silicon, or the like added to iron. The magnetic particles 55 may be provided in a form such as an amorphous magnetic powder, a soft magnetic powder containing a nanocrystalline magnetic powder, or the like.

The conductive film 57 may be formed by plating or coating a conductive material on the magnetic particles 55. Such a conductive material may include nickel (Ni), palladium (Pd), silver (Ag), graphite (C), and the like.

Figure 4A:
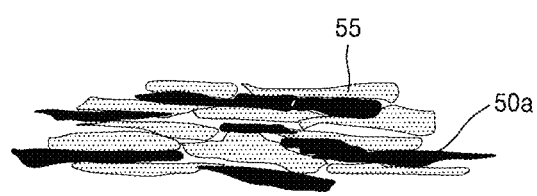
FIGS. 4A and 4B are schematic views showing an electromagnetic interference shielding layer according to an embodiment of the present invention.

For example, the electromagnetic interference shielding layer 130 may be formed by spraying a paste containing the metal particles 50 and the magnetic particles 55, as shown in FIG. 3A, onto the electronic component 100 and then, thermally treating it. Accordingly, as shown in FIG. 4A, the metal particles 50 in the paste may be sintered on the surface of the magnetic particles 55 to form the conductive portion 50a so as to be connected to each other as a whole.

Figure 4B:
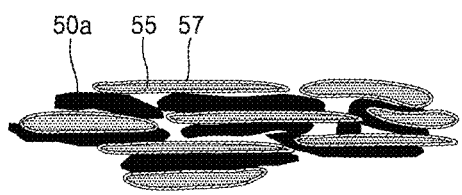

As another example, the electromagnetic interference shielding layer 130 may be formed by spraying a paste containing the metal particles 50 and the magnetic particles having the conductive film 57 formed, as shown in FIG. 3B, onto the electronic component 100 and then, thermally treating it. Accordingly, as shown in FIG. 4B, the metal particles 50 in the paste may be sintered on the surface of the conductive film 57 to form the conductive portion 50a so as to be connected to each other as a whole.

Accordingly, the electromagnetic interference shielding layer 130 is to have conductivity as a whole to shield electromagnetic waves and further may effectively absorb the low frequency band through the magnetic particles 55 to block electromagnetic waves as a whole.

Figure 6A:
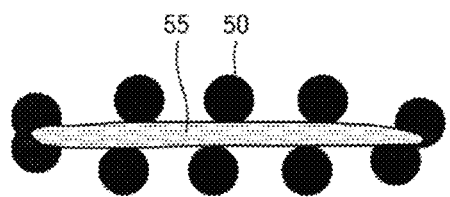
FIG. 6A is a schematic view showing the contact characteristics of metal particles according to the absence of a conductive film in FIG. 3A.
Figure 6B:
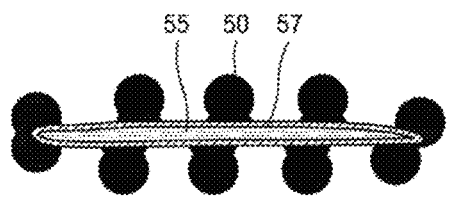
FIG. 6B is a schematic view showing the contact characteristics of metal particles according to the presence of a conductive film in FIG. 3B.

As shown in FIGS. 6A and 6B, in the case of (FIG. 6B) in which the conductive film 57 is present as compared with the case of (FIG. 6A) in which the conductive film 57 is not provided on the magnetic particles 55, the contact angle of the metal particles 50 on the magnetic particles 55 becomes larger. Therefore, the adhesion of the metal particles 50 to the magnetic particles 55 during sintering may be improved, and as a result, the thermal and electrical conductivity of the electromagnetic interference shielding layer 130 may be improved.

On the other hand, the paste may further contain a solvent for controlling the flow characteristics of the paste. For example, the paste may further include at least two types of solvents having different boiling points to control their flowability at the side portion of the electronic component 100 during the spraying process.

In the spraying process, the paste may be applied on the upper portion of the electronic component 100 and flow down to the side portion. In this case, the solvent in the paste may be partially volatilized over time and the flowability of the paste on the side portion of the electronic component 100 may be lowered. However, if a low boiling point solvent having a low boiling point and a high boiling point solvent having a high boiling point are mixed in the paste, even if some low boiling point solvents are volatilized, the high boiling point solvent is hardly volatilized, so that a certain degree of flowability may be maintained. In order to control the flowability more precisely, the solvent may be composed of three or more kinds of solvents having different boiling points.

For example, a low boiling point solvent may include at least one selected from 3-methoxy butyl acetate, cyclohexyl acetate, 2-Ethoxyethyl acetate, SHELLSOL 71, tert-butyl cellosolve, di iso butyl ketone, Kocosol 100, cyclohexanone, ethyl cellosolve, 2-methoxy-1-methylethyl acetate, methyl iso butyl carbinol, 2-nitro propane, solvent v-1, Propylene glycol monomethyl ether, turpentine oil, n-butyl alcohol, iso butyl alcohol, xylene, iso amyl acetate, n-amyl acetate, n-butyl acetate, iso butyl acetate, methyl iso butyl ketone, ethyl alcohol, iso propyl alcohol, methyl alcohol, and toluene.

A high boiling point solvent may include at least one selected from texanol (ester alcohol), butyl carbitol acetate, ethylene glycol, 2-ethyl hexyl glycol, carbitol acetate, di basic ester, propylene glycol, isophorone, benzyl alcohol, methyl carbitol, 2-ethyl hexyl acetate, n-methyl-2-pyrrolidone, dipropylene glycol methyl ester, ethyl carbitol, hexyl cellosolve, kocosol#180, butyl carbitol, 2-ethyl hexyl alcohol, methyl hexyl ketone, butyl cellosolve acetate, 3-methyl-3-methoxy butanol, kocosol#150, butyl cellosolve, di acetone alcohol, and 3-methoxy butyl acetate.

According to the electronic device 150, the electromagnetic wave in the low frequency band may be effectively blocked by the single electromagnetic interference shielding layer 130 and the electromagnetic interference shielding layer 130 may be uniformly formed on the side surface by adjusting the boiling point of the solvent.

Hereinafter, a method of manufacturing the above-described electronic device 150 will be described.

A method of manufacturing an electronic device 150 according to an embodiment of the present invention includes providing an electronic component 100 and forming an electromagnetic interference shielding layer on at least a portion of the electronic component 100.

Figure 2:
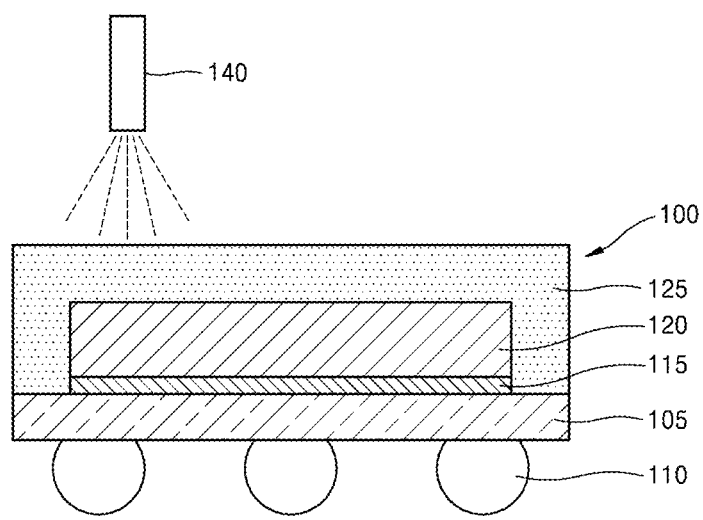
FIG. 2 is a schematic cross-sectional view showing a method of manufacturing an electronic device according to an embodiment of the present invention.

The forming of the electromagnetic interference shielding layer 130, as shown in FIG. 2, may include spraying a paste comprising metal particles 50 and magnetic particles 55 onto at least a portion of the electronic component 100 using a spray nozzle 140 and thermally treating the applied paste.

The paste may include the metal particles 50 and the magnetic particles 55 as shown in FIG. 3A, or may include the metal particles 50 and the magnetic particles 55 having a conductive film 57 formed as shown in FIG. 3B.

The heat treatment may be set appropriately such that the metal particles 50 are fused and sintered at the surfaces of the magnetic particles 55 or the metal particles 50 are fused and sintered at the surfaces of the magnetic particles 55 where the conductive film 57 is formed, and for example, the heat treatment may be performed at a temperature in the range of 150° C. to 300° C. Specifically, when the metal particles 50 are organic silver particles, they may be selected in a range of about 150° C. to about 260° C. For example, the heat treatment operation may include curing the paste in a range of 150° C. to 200° C. and reflowing it in a range of 230° C. to 260° C.

Figure 5:
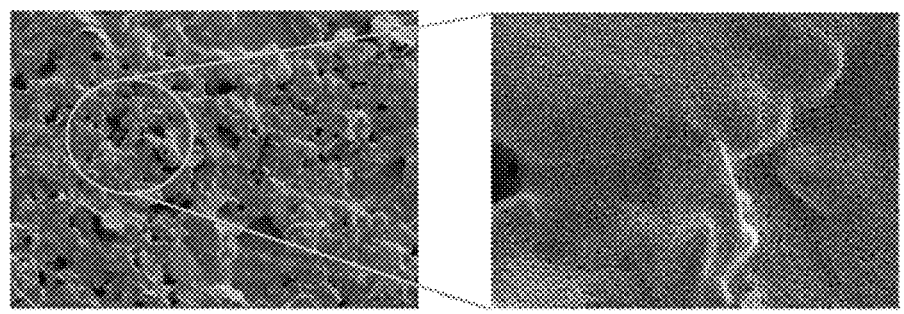
FIG. 5 is a scanning electron microscope image showing the surface of an electromagnetic interference shielding layer formed on an electronic device according to an experimental example of the present invention.

FIG. 5 is a scanning electron microscope image showing the surface of an electromagnetic interference shielding layer formed on an electronic device according to an experimental example of the present invention.

Referring to FIG. 5, it may be seen that the metal particles 50 are sintered on the magnetic particles 55 to form the conductive portion 50a.

According to the method of manufacturing the electronic device 150, the electromagnetic wave shielding material and absorbing material do not need to be formed as separate layers, and may be economically formed into a single layer through a sintering process.

According to embodiments of the present invention as described above, an electromagnetic interference shielding layer including an electromagnetic wave shielding material and an electromagnetic wave absorbing material may be economically manufactured. Furthermore, conductive films may be used to increase the contact angle of metal particles on the surface of magnetic particles to improve adhesion, thermal conductivity, and electrical conductivity. Of course, the scope of the present invention is not limited by these effects.

Although the present invention has been described with reference to the embodiments shown in the drawings, it is only illustrative, and it will be understood by those skilled in the art that various changes and modifications may be made without departing from the scope of the present invention. Accordingly, the true scope of the present invention should be determined by the technical idea of the appended claims.

What is claimed is:

1. An electronic device comprising:
   an electronic component; and
   an electromagnetic interference shielding layer disposed on at least a portion of the electronic component,
   wherein the electromagnetic interference shielding layer comprises:
   magnetic particles for electromagnetic wave absorption, each of the magnetic particles having a conductive film on a surface of the magnetic particle; and
   a conductive portion where conductive metal particles for electromagnetic interference shielding are sintered and formed on the conductive film of the magnetic particles.

2. The electronic device of claim 1, wherein the electromagnetic interference shielding layer is formed by spraying a paste containing the conductive metal particles and the magnetic particles where the conductive film is formed, on the electronic component and then, thermally treating the applied paste.

3. The electronic device of claim 2, wherein in the paste, the metal particles are organic metal particles, and the magnetic particles are in the shape of flakes.

4. The electronic device of claim 3, wherein the organic metal particles comprise organic silver particles.

5. The electronic device of claim 2, wherein the paste further comprises at least two types of solvents having different boiling points so as to control the flowability of the paste at a side portion of the electronic component during a spraying process.

6. The electronic device of claim 1, wherein the electromagnetic interference shielding layer has a structure in which the metal particles are sintered on a surface of the magnetic particles so as to be entirely connected to each other to have conductivity.

7. The electronic device of claim 1, wherein the conductive film is formed by plating a conductive material on the magnetic particles,
   wherein the conductive material comprises nickel (Ni), palladium (Pd), silver (Ag), or graphite (C).

8. The electronic device of claim 1, wherein the electronic component is a semiconductor package comprising:
   a package substrate;
   a semiconductor element mounted on the package substrate; and
   a molding member for protecting the semiconductor element,
   wherein the electromagnetic interference shielding layer is formed on an upper portion and a side portion of the semiconductor package.

9. A method of manufacturing an electronic device, the method comprising:
   providing an electronic component; and
   forming an electromagnetic interference shielding layer on at least a portion of the electronic component,
   wherein the electromagnetic interference shielding layer comprises:
   magnetic particles for electromagnetic wave absorption, each of the magnetic particles having a conductive film on a surface of the magnetic particle; and
   a conductive portion where conductive metal particles for electromagnetic interference shielding are sintered and formed on the conductive film of the magnetic particles.

10. The method of claim 9, wherein the forming of the electromagnetic interference shielding layer comprises:
    spraying a paste containing the conductive metal particles and the magnetic particles where the conductive film is formed, on at least a portion of the electronic component; and
    thermally treating the applied paste.

11. The method of claim 10, wherein in the spraying of the paste, the paste further comprises at least two types of solvents having different boiling points so as to control the flowability of the paste at a side portion of the electronic component.

12. An electronic device comprising:
    an electronic component; and
    an electromagnetic interference shielding layer where conductive metal particles for electromagnetic interference shielding are sintered on a surface of magnetic particles for electromagnetic wave absorption and are formed as a conductive layer, on at least a portion of the electronic component.

13. The electronic device of claim 12, wherein the electromagnetic interference shielding layer is formed by spraying a paste containing the conductive metal particles and the magnetic particles on the electronic component and then, thermally treating the applied paste.

14. The electronic device of claim 13, wherein the paste further comprises at least two types of solvents having different boiling points so as to control the flowability of the paste at a side portion of the electronic component during a spraying process.

15. The electronic device of claim 12, wherein the electromagnetic interference shielding layer has a structure in which the metal particles are sintered on a surface of the magnetic particles so as to be entirely connected to each other to have conductivity.

* * * * *